United States Patent
Tsai et al.

(10) Patent No.: US 10,720,521 B2
(45) Date of Patent: Jul. 21, 2020

(54) ENHANCEMENT MODE GALLIUM NITRIDE BASED TRANSISTOR DEVICE AND MANUFACTURING METHOD THEREOF

(71) Applicant: Industrial Technology Research Institute, Hsin-Chu (TW)

(72) Inventors: Jung-Tse Tsai, Hsinchu County (TW); Po-Chun Yeh, Taichung (TW); Chien-Hua Hsu, New Taipei (TW); Po-Tsung Tu, Tainan (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 0 days.

(21) Appl. No.: 16/359,345

(22) Filed: Mar. 20, 2019

(65) Prior Publication Data
US 2020/0168728 A1 May 28, 2020

(30) Foreign Application Priority Data
Nov. 23, 2018 (TW) .............................. 107141841 A

(51) Int. Cl.
*H01L 21/338* (2006.01)
*H01L 29/66* (2006.01)
*H01L 29/778* (2006.01)
*H01L 29/20* (2006.01)
*H01L 29/12* (2006.01)

(52) U.S. Cl.
CPC ........ *H01L 29/7786* (2013.01); *H01L 29/122* (2013.01); *H01L 29/2003* (2013.01); *H01L 29/66431* (2013.01); *H01L 29/66462* (2013.01); *H01L 29/778* (2013.01); *H01L 2924/13064* (2013.01)

(58) Field of Classification Search
CPC ........... H01L 29/66431; H01L 29/7786; H01L 29/122
USPC .......................... 257/190–195; 438/172–175
See application file for complete search history.

(56) References Cited

U.S. PATENT DOCUMENTS

| 6,914,273 | B2 | 7/2005 | Ren et al. |
| 8,129,749 | B2 | 3/2012 | Pillarisetty et al. |
| 8,723,226 | B2 | 5/2014 | Bahl |
| 8,823,012 | B2 | 9/2014 | Lidow et al. |
| 8,890,168 | B2 | 11/2014 | Lidow et al. |
| 8,981,344 | B2 * | 3/2015 | Jain ........................ B82Y 10/00 257/24 |
| 9,490,321 | B2 * | 11/2016 | Taylor ..................... H01L 33/06 |
| 9,502,602 | B2 * | 11/2016 | Huang .................. H01L 33/002 |
| 9,960,154 | B2 | 5/2018 | Kinzer |
| 10,062,775 | B2 * | 8/2018 | Huang .................. H01L 29/205 |

(Continued)

FOREIGN PATENT DOCUMENTS

| CN | 1658454 | 8/2005 |
| TW | 201712869 | 4/2017 |
| TW | 201803116 | 1/2018 |

OTHER PUBLICATIONS

TW OA issued on Oct. 1, 2019.
(Continued)

*Primary Examiner* — Calvin Lee
(74) *Attorney, Agent, or Firm* — WPAT, PC

(57) ABSTRACT

An enhancement mode GaN transistor is provided, which includes a GaN layer, a quantum well structure, a gate, a source a drain and a first barrier layer. The quantum well structure is disposed on the upper surface of the GaN layer. The gate is disposed on the quantum well structure. The source is disposed on one end of the upper surface of the GaN layer. The drain is disposed on the other end of the upper surface of the GaN layer. The first barrier layer is disposed on the upper surface of the GaN layer and extends to the lateral surfaces of the quantum well structure.

21 Claims, 13 Drawing Sheets

(56) References Cited

U.S. PATENT DOCUMENTS

| | | |
|---|---|---|
| 2006/0148182 A1 | 7/2006 | Datta et al. |
| 2008/0203430 A1 | 8/2008 | Simin et al. |
| 2012/0217512 A1* | 8/2012 | Renaud ............. H01L 29/41766 257/76 |
| 2014/0014966 A1 | 1/2014 | Tabatabaie et al. |
| 2016/0204207 A1 | 7/2016 | Then et al. |

OTHER PUBLICATIONS

Z. H. Feng, R. Zhou, S. Y. Xie, J. Y. Yin, J. X. Fang, B. Liu, W. Zhou, K. J. Chen, and S. J. Cai, "18-GHz 3.65 W/mm enhancement-mode AlGaN/GaN HFET using fluorine plasma ion implantation," IEEE Electron Device Lett., vol. 31, No. 12, pp. 1386-1388, 2010.

K. Miyatsuji, H. Hihara and C. Hamaguchi, "Single Quantum Well Trnsistor With Modulation Doped AlGaAs/GaAs/AlGaAs Structures," Superlattices and Microstructures, vol. 1, No. 1, 1985.

N. Ikeda, Y. Niiyama, H. Kambayashi, Y. Sato, T. Nomura, S. Kato, and S. Yoshida, "GaN power transistors on Si substrates for switching applications," Proc. IEEE, vol. 98, No. 7, pp. 1151-1161, 2010.

S. Liu, Y. Cai, G. Gu, J.Wang, C. Zeng,W. Shi, Z. Feng, H. Qin, Z. Cheng, C. Chen, and B. Zhang, "Enhancement-mode operation of nanochannel array (NCA) AlGaN/GaN HEMTs," IEEE Electron Device Lett., vol. 33, No. 3, pp. 354-356, 2012.

T. Oka and T. Nozawa, "AlGaN/GaN recessed MIS-Gate HFET with high-threshold-voltage normally-off operation for power electronics applications," IEEE Electron Device Lett., vol. 29, pp. 668-670, 2008.

\* cited by examiner

ENHANCEMENT MODE GALLIUM NITRIDE BASED TRANSISTOR DEVICE AND MANUFACTURING METHOD THEREOF

CROSS REFERENCE TO RELATED APPLICATION

The application is based on, and claims priority from, Taiwan Application Serial Number 107141841, filed on Nov. 23, 2018, the disclosure of which is hereby incorporated by reference herein in its entirety.

TECHNICAL FIELD

The disclosure relates to an enhancement mode GaN based transistor device, and relates to an enhancement mode GaN based transistor device having quantum well structure. The disclosure further relates to the method for manufacturing the enhancement mode GaN based transistor device.

BACKGROUND

Gallium Nitride high electron mobility transistors (GaN HEMT) have many advantages, such as high voltage resistance, low channel resistance and high electron drift velocity, etc., so can be applied to high-speed switching devices and high-power devices. The transistor devices can form high-concentration two-dimension electron gas (2DEG) and improve the transmission characteristics, which can obviously better the output current density and the on-resistance thereof. However, the transistor devices tend to be normally on because of high-concentration two-dimension electron gas, so usually cannot be applied to enhancement mode or normally-off transistor devices. Thus, the application of the transistor devices is limited.

Enhancement mode transistor devices are more easily integrated into microwave circuits and logic circuits, and can save more energy. Currently, major enhancement mode transistor devices include recessed gate transistor device, p-(Al)GaN epitaxial layer transistor device and F$^-$ Ion implant transistor device, etc.

SUMMARY

An embodiment of the disclosure provides an enhancement mode GaN transistor device, which includes a GaN layer, a quantum well structure, a gate, a source a drain and a first barrier layer. The quantum well structure is disposed on the upper surface of the GaN layer. The gate is disposed on the quantum well structure. The source is disposed on one end of the upper surface of the GaN layer. The drain is disposed on the other end of the upper surface of the GaN layer. The first barrier layer is disposed on the upper surface of the GaN layer and extends to the lateral surfaces of the quantum well structure.

Another embodiment of the disclosure provides a method for manufacturing enhancement mode GaN transistor device, which includes the following steps: forming an epitaxy stack including a GaN layer, a quantum well layer and two barrier layers, wherein the quantum well layer and the barrier layers are disposed on the upper surface of the GaN layer, and the quantum well structure is disposed between the barrier layers; etching the epitaxy stack to make the quantum well layer and the barrier layers form a quantum well structure on the upper surface of the GaN layer; depositing a first barrier layer on the upper surface of the GaN layer and the lateral surfaces of the quantum well structure; forming a source on one end of the upper surface of the GaN layer; forming a drain on the other end of the upper surface of the GaN layer; and forming a gate on the quantum well structure.

Further scope of applicability of the application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The invention will become more fully understood from the detailed description given herein below and the accompanying drawings which are given by way of illustration only, and thus are not limitative of the invention and wherein.

DETAILED DESCRIPTION

Figure 1:
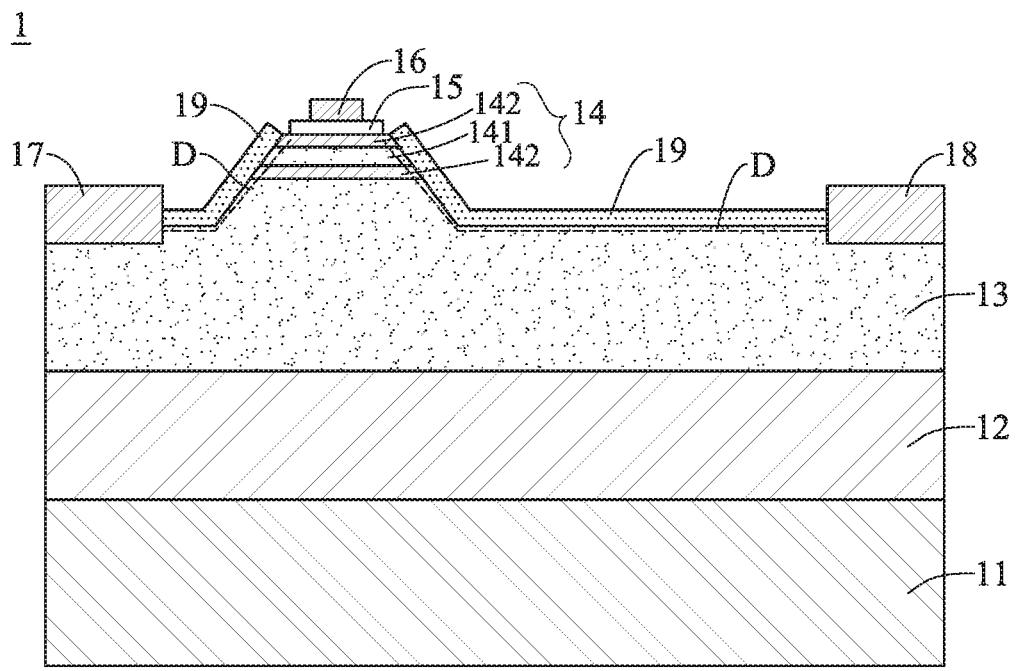
FIG. 1 is a cross-sectional view of an enhancement mode GaN transistor device in accordance with a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
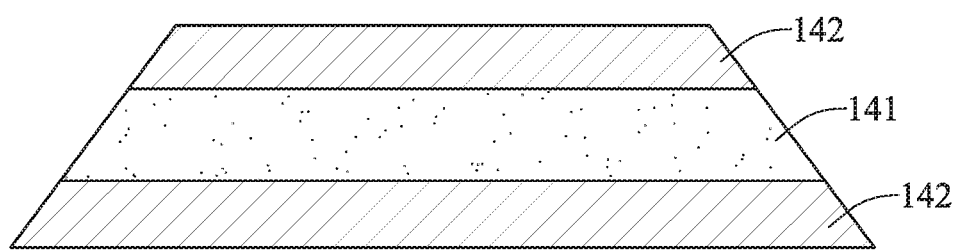
FIG. 2 is a cross-sectional view of a quantum well structure of the enhancement mode GaN transistor device in accordance with the first embodiment of the disclosure.

Please refer to FIG. 1 and FIG. 2. FIG. 1 is a cross-sectional view of an enhancement mode GaN transistor device in accordance with a first embodiment of the disclosure; FIG. 2 is a cross-sectional view of the quantum well structure of the enhancement mode GaN transistor device. As shown in FIG. 1, the enhancement mode GaN transistor device 1 includes a substrate 11, a buffer layer 12, a GaN layer 13, a quantum well structure 14, a dielectric 15, a gate 16, a source 17, a drain 18 and a first barrier layer 19.

The buffer layer 112 is disposed on the substrate 11. The GaN layer 13 is disposed on the buffer layer 12. The quantum well structure 14 is disposed on the upper surface of the GaN layer 13. The dielectric 15 is disposed on the quantum well structure 14. In the embodiment, the quantum well structure is a cone, and the gate 16 is disposed on the tip of the cone or the plane surface on the top of the cone. In another embodiment, the quantum well structure 14 may be in other different 3D geometric shapes. The gate 16 is disposed on the dielectric 15. The source 17 is disposed on one end of the upper surface of the GaN layer 13. The drain 18 is disposed on the other end of the upper surface of the GaN layer 13. The first barrier layer 19 is disposed on the upper surface of the GaN layer 13 and extends to the lateral surfaces of the quantum well structure 14, but does not cover the gate 16 and the dielectric 15. More specifically, the material of the first barrier layer 19 is Al(x)In(y)Ga(1-x-y)N and the lattice constant of the first barrier layer 19 is less than that of the GaN layer 13. The first barrier layer 19 is a re-grown barrier layer, which can be re-grown on the GaN layer via metal-organic chemical vapor deposition (MOCVD). The two-dimension electron gas D (2DEG) can be formed under the first barrier layer 19.

As described above, the GaN transistor device 1 has the 3D conical quantum well structure 14, and the gate 16 thereof is disposed on the tip of the cone or the plane surface on the top of the cone.

As shown in FIG. 2, the quantum well structure 14 includes a quantum well layer 141 and two barrier layers 142. In one embodiment, the material of the quantum well layer 141 is Al(x)In(y)Ga(1-x-y)N (0≤x≤1, 0≤y≤1 and 0≤x+y≤1); besides, the width of the quantum well layer 141 is about 1 A~1000 A; the material of the barrier layers 142 is Al(a)In(b)Ga(1-a-b)N(以下修改如前) (0≤a≤1, 0≤b≤1 and 0≤a+b≤1).

The quantum well layer 141 is disposed between the barrier layers 142. Besides, the band gap of the barrier layers 142 is greater than that of the quantum well layer 141. Further, the average lattice constant of the quantum well structure 14 is greater than the lattice constant of the GaN layer 13; therefore, the conduction band of the quantum well structure 14 can be away from Fermi level.

In addition, when the voltage is applied to the gate 16 to turn on the GaN transistor device 1, the quantum well structure 14 can provide confined level for the transmission of the carriers, so the performance of the GaN transistor device 1 can be improved.

Furthermore, the anti-polarization characteristic of the quantum well structure 14 can effectively lift the energy level of the channels of the quantum well structure 14 and drive away the two-dimension electron gas D. In this way, when the voltage is not applied to the gate 16, the energy level of the channels of the quantum well structure 14 can be away from Fermi level. Thus, the GaN transistor device 1 can completely conform to the requirements of normally-off transistor devices.

The embodiment exemplifies the disclosure and is not intended to limit the scope of the disclosure. Any equivalent modification and variation according to the spirit of the disclosure is to be also included within the scope of the following claims and their equivalents.

Figure 3A:
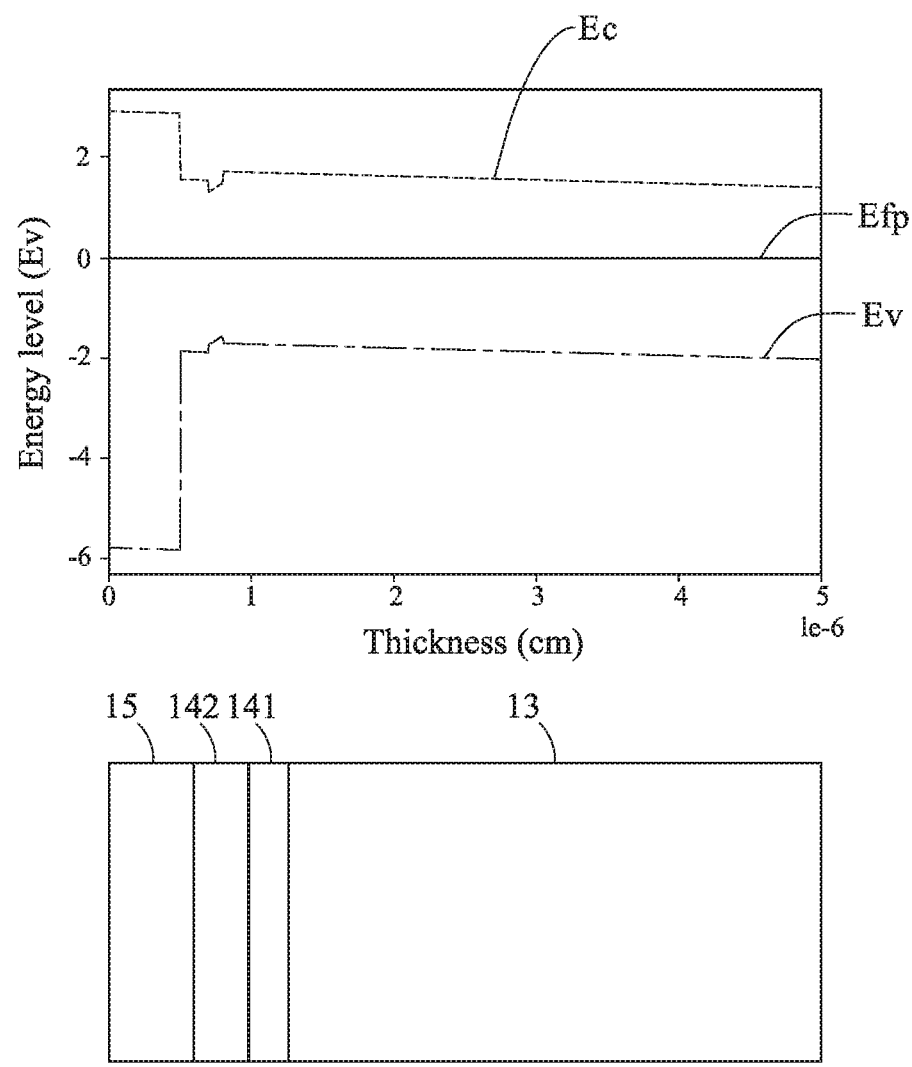
FIG. 3A~FIG. 3B are simulation results of the enhancement mode GaN transistor device in accordance with the first embodiment of the disclosure.
Figure 3B:
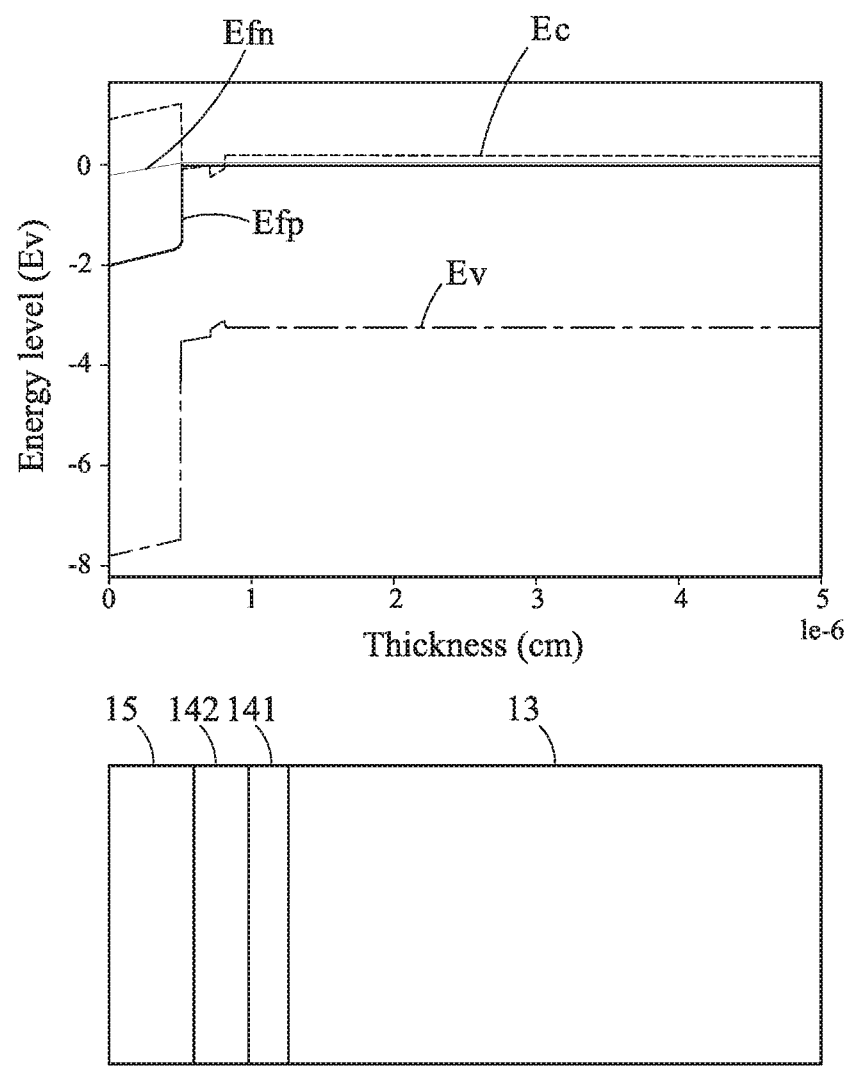

Please refer to FIG. 3A and FIG. 3B. FIG. 3A~FIG. 3B are simulation results of the enhancement mode GaN transistor device in accordance with the first embodiment of the disclosure. The simulation parameters of the embodiment are as shown in Table 1, as follows:

TABLE 1

| Simulation parameters | |
| --- | --- |
| Dielectric constant of dielectric ($Al_2O_3$) | 9.3 |
| Energy level of dielectric ($Al_2O_3$) | 8.7 eV |
| dEc (AlN/GaN) | 1.9 eV |
| dEc ($Al_2O_3$/GaN) | 2.2 eV |
| Ni/$Al_2O_3$ | 2.9 eV |
| Electron affinity of dielectric ($Al_2O_3$) | 2.58 eV |

As shown in FIG. 3A, the horizontal axis stands for the thickness (which is corresponding to the positions of the dielectric 15 ($Al_2O_3$), the barrier layers 142 (GaN), the quantum well layer 141 ($In_{0.1}Ga_{0.9}N$) and the GaN layer 13); the vertical axis stands for the energy level; the curve Ec stands for the conduction band; the curve Ev stands for the valence band; the curve Efp stands for Fermi level (electron hole). When the voltage is not applied to the gate 16 (Vg=0), the conduction band Ec of the quantum well structure 14 can be away from Fermi level.

As shown in FIG. 3B, the horizontal axis stands for the thickness, the vertical axis stands for the energy level, the curve Ec stands for the conduction band, the curve Ev stands for the valence band, the curve Efp stands for Fermi level (electron hole), and the curve Efn stands for Fermi level (electron). When the voltage is applied to the gate 16 (Vg=2), the conduction band Ec of the quantum well structure 14 can exceed Fermi level.

Figure 4:
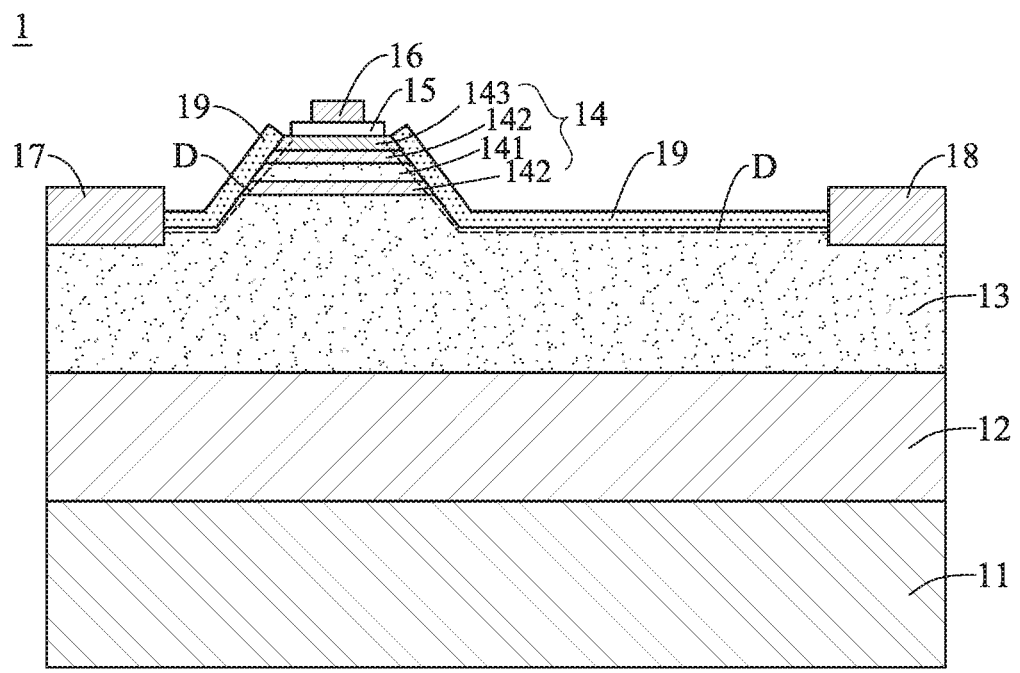
FIG. 4 is a cross-sectional view of an enhancement mode GaN transistor device in accordance with a second embodiment of the disclosure.
Figure 5:
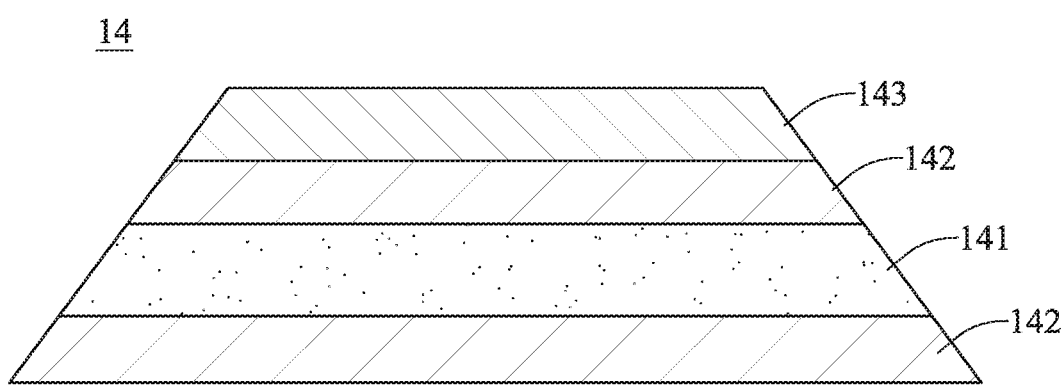
FIG. 5 is a cross-sectional view of a quantum well structure of the enhancement mode GaN transistor device in accordance with the second embodiment of the disclosure.

Please refer to FIG. 4 and FIG. 5. FIG. 4 is a cross-sectional view of an enhancement mode GaN transistor device in accordance with a second embodiment of the disclosure. FIG. 5 is a cross-sectional view of the quantum well structure of the enhancement mode GaN transistor device. As shown in FIG. 4, the enhancement mode GaN transistor device 1 includes a substrate 11, a buffer layer 12, a GaN layer 13, a quantum well structure 14, a dielectric 15, a gate 16, a source 17, a drain 18 and a first barrier layer 19.

The structures of the above elements and the cooperation relation thereof are similar to the previous embodiment, so will not be described herein. The difference between the embodiment and the previous embodiment is that the quantum well structure 14 of the GaN transistor device 1 further includes an anti-polarization layer 143.

As shown in FIG. 5, the quantum well layer 141 is disposed between the barrier layers 142 and the anti-polarization layer 143 is disposed on the quantum well layer 141 and the barrier layers 142. The average lattice constant of the anti-polarization layer 143 is greater than the lattice constant of the GaN layer 113. Similarly, the band gap of the barrier layers 142 is greater than that of the quantum well layer 141. As described above, in the embodiment, the conduction band of the quantum well structure 14 can be away from Fermi level via the anti-polarization layer 143.

Similarly, when the voltage is applied to the gate 16 to turn on the GaN transistor device 1, the quantum well structure 14 can provide confined level for the transmission of the carriers, such that the performance of the GaN transistor device 1 can be improved.

Besides, the anti-polarization layer 143 of the quantum well structure 14 can provide anti-polarization characteristic, which can effectively lift the energy level of the channels of the quantum well structure 14 and drive away two-dimension electron gas D. Thus, when the voltage is not applied to the gate 16, the energy level of the channels of the quantum well structure 14 can be away from Fermi level, so the GaN transistor device 1 can completely conform to the requirements of normally-off transistor devices.

The embodiment just exemplifies the disclosure and is not intended to limit the scope of the disclosure. Any equivalent modification and variation according to the spirit of the disclosure is to be also included within the scope of the following claims and their equivalents.

Figure 6A:
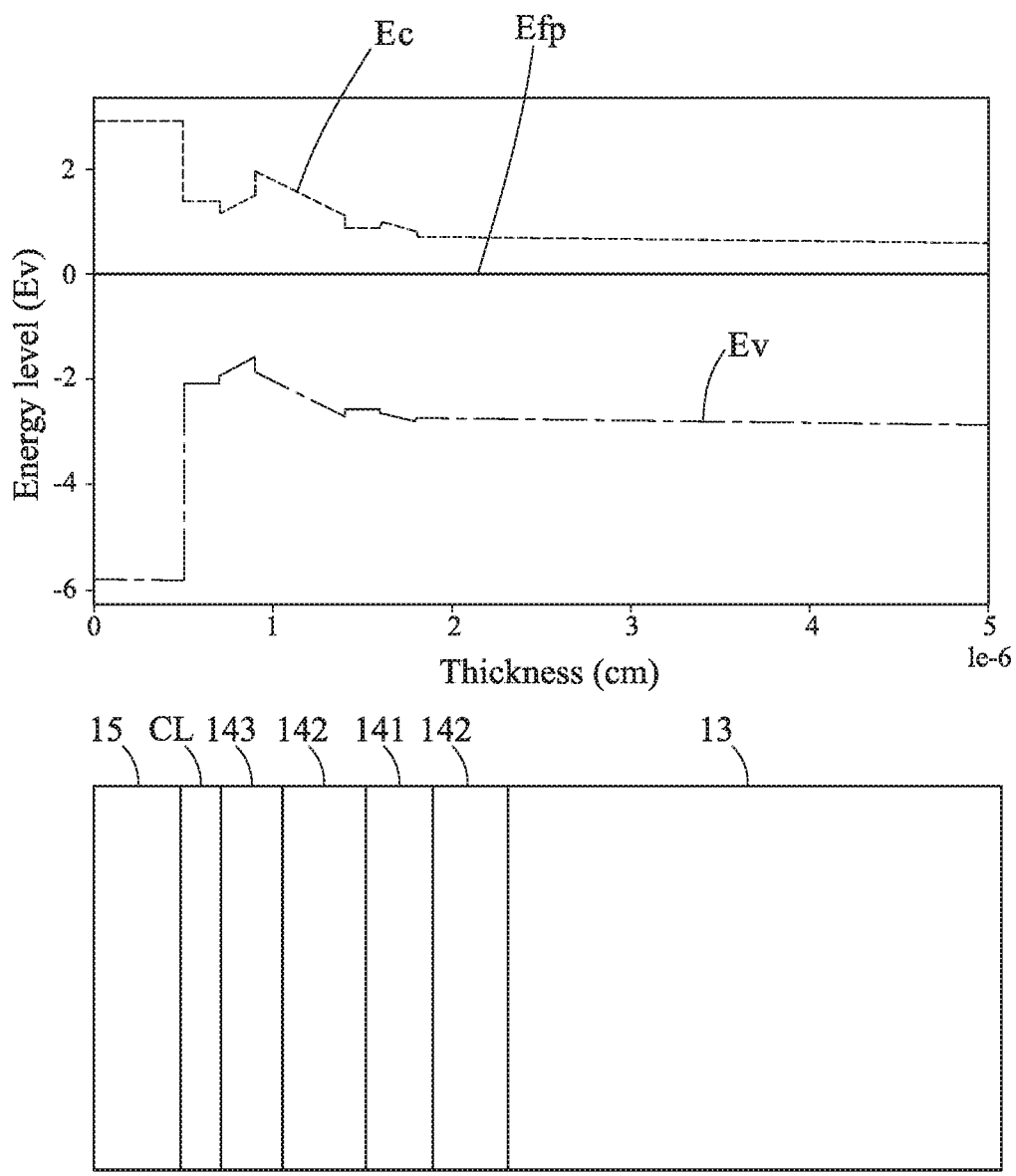
FIG. 6A~FIG. 6B are simulation results of the enhancement mode GaN transistor device in accordance with the second embodiment of the disclosure.
Figure 6B:
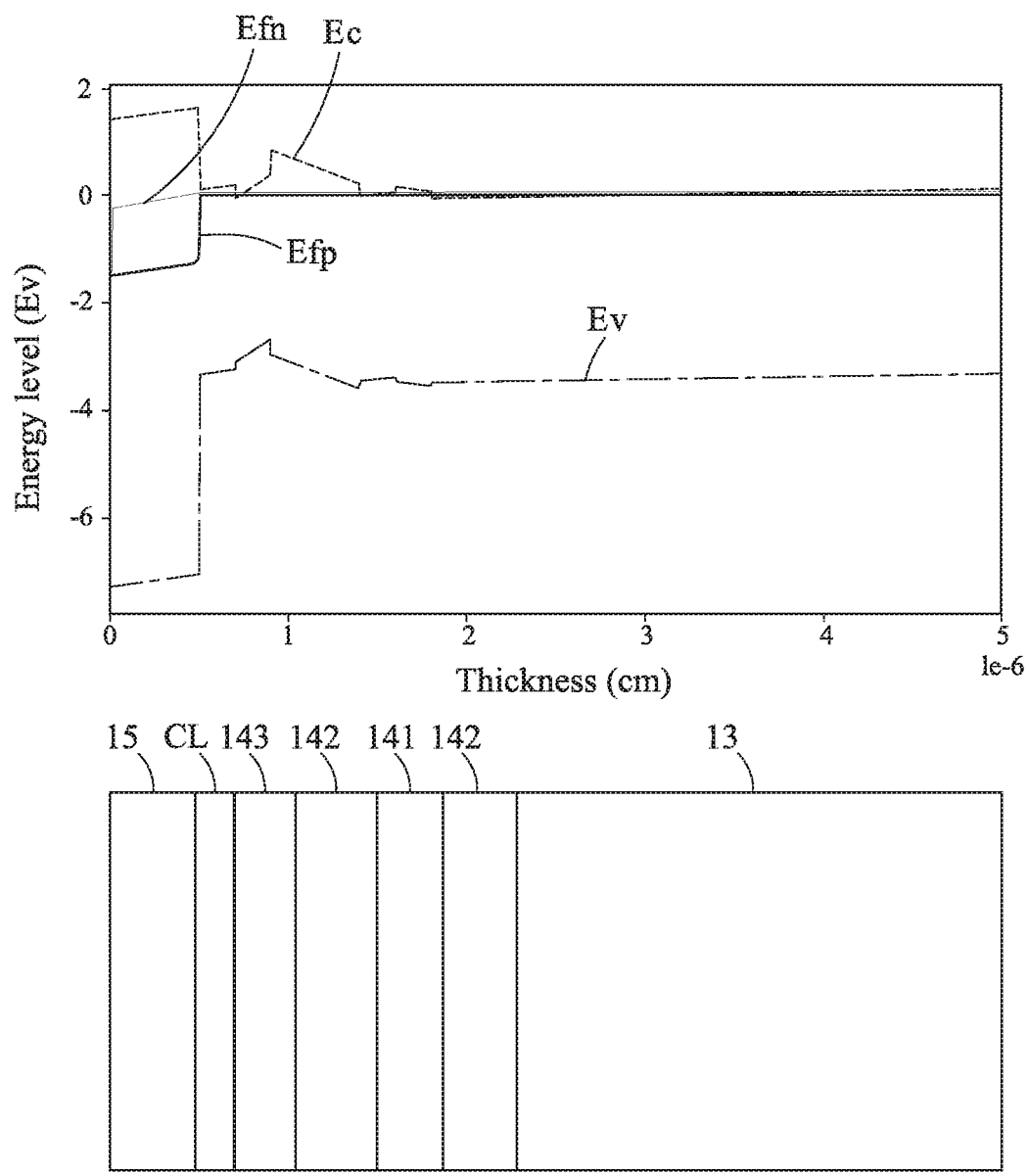

Please refer to FIG. 6A and FIG. 6B. FIG. 6A~FIG. 6B are simulation results of the enhancement mode GaN transistor device in accordance with the second embodiment of the disclosure. The simulation parameters of the embodiment are as shown in Table 2, as follows:

TABLE 2

| Simulation parameters | |
|---|---|
| Dielectric constant of dielectric ($Al_2O_3$) | 9.3 |
| Energy level of dielectric ($Al_2O_3$) | 8.7 eV |
| dEc (AlN/GaN) | 1.9 eV |
| dEc ($Al_2O_3$/GaN) | 2.2 eV |
| Ni/$Al_2O_3$ | 2.9 eV |
| Electron affinity of dielectric ($Al_2O_3$) | 2.58 eV |

As shown in FIG. 6A, the horizontal axis stands for the thickness (which is corresponding to the positions of the dielectric 15 ($Al_2O_3$), the capping layer CL, the anti-polarization layer 143 ($In_{0.1}Ga_{0.9}N$), the barrier layers 142 ($Al_{0.2}Ga_{0.8}N$), the quantum well layer 141 and the GaN layer 13). The vertical axis stands for the energy level, the curve Ec stands for the conduction band, the curve Ev stands for the valence band, and the curve Efp stands for Fermi level (electron hole). When the voltage is not applied to the gate 16 (Vg=0), the conduction band Ec of the quantum well structure 14 can be away from Fermi level.

As shown in FIG. 6B, the horizontal axis stands for the thickness, the vertical axis stands for the energy level, the curve Ec stands for the conduction band, the curve Ev stands for the valence band, the curve Efp stands for Fermi level (electron hole), and the curve Efn stands for Fermi level (electron). When the voltage is applied to the gate 16 (Vg=2), the conduction band Ec of the quantum well structure 14 can exceed Fermi level.

Figure 7:
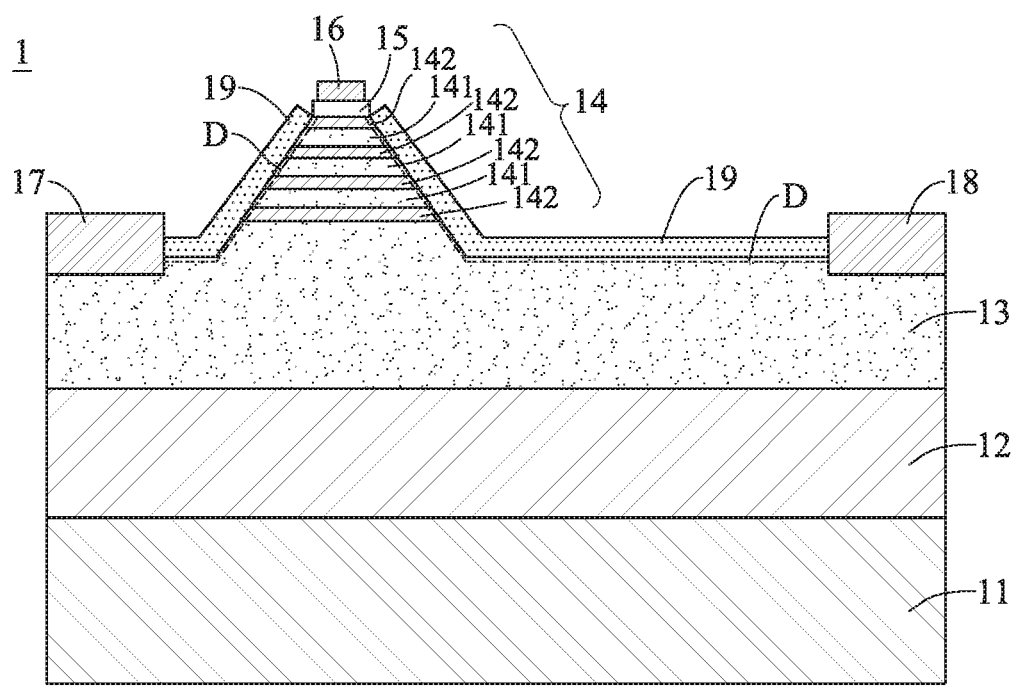
FIG. 7 is a cross-sectional view of an enhancement mode GaN transistor device in accordance with a third embodiment of the disclosure.
Figure 8:
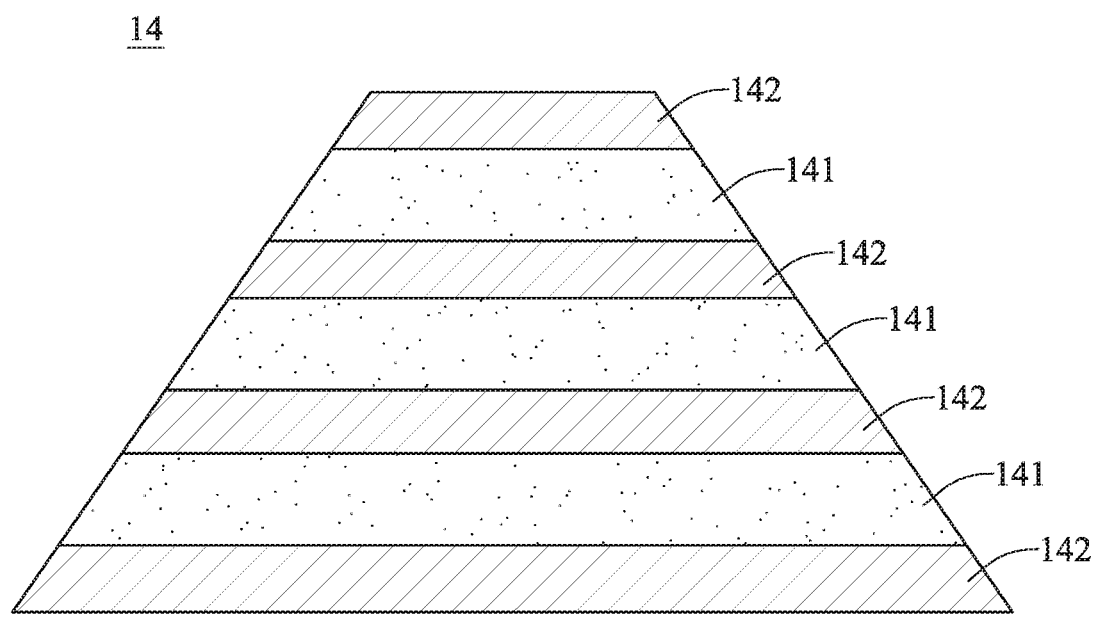
FIG. 8 is a cross-sectional view of a quantum well structure of the enhancement mode GaN transistor device in accordance with the third embodiment of the disclosure.

Please refer to FIG. 7 and FIG. 8. FIG. 7 is a cross-sectional view of an enhancement mode GaN transistor device in accordance with a third embodiment of the disclosure. FIG. 8 is a cross-sectional view of the quantum well structure of the enhancement mode GaN transistor device. As shown in FIG. 7, the enhancement mode GaN transistor device 1 includes a substrate 11, a buffer layer 12, a GaN layer 13, a quantum well structure 14, a dielectric 15, a gate 16, a source 17, a drain 18 and a first barrier layer 19.

The buffer layer 112 is disposed on the substrate 11. The GaN layer 13 is disposed on the buffer layer 12. The quantum well structure 14 is disposed on the upper surface of the GaN layer 13. In the embodiment, the quantum well structure 14 is a multi-layer structure, which includes plural current paths. The dielectric 15 is disposed on the quantum well structure 14. In the embodiment, the quantum well structure is a cone, and the gate 16 is disposed on the tip of the cone or the plane surface on the top of the cone. The gate 16 is disposed on the dielectric 15. The source 17 is disposed on one end of the upper surface of the GaN layer 13. The drain 18 is disposed on the other end of the upper surface of the GaN layer 13. The first barrier layer 19 is disposed on the upper surface of the GaN layer 13 and extends to the lateral surfaces of the quantum well structure 14, but does not cover the gate 16 and the dielectric 15. The material of the first barrier layer 19 is Al(x)In(y)Ga(1-x-y)N and the lattice constant of the first barrier layer 19 is less than that of the GaN layer 13. The two-dimension electron gas (2DEG) D can be formed under the first barrier layer 19.

As described above, the GaN transistor device 1 has the 3D conical quantum well structure 14 having multiple layers, and the gate 16 thereof is disposed on the tip of the cone or the plane surface on the top of the cone.

As shown in FIG. 8, the quantum well structure 14 includes plural quantum well layers 141 and plural barrier layers 142. In one embodiment, the material of the quantum well layers 141 is Al(x)In(y)Ga(1-x-y)N (0≤x≤1, 0≤y≤1 and 0≤x+y≤1); besides, the width of the quantum well layers 141 is about 1 Å~1000 Å. The material of the barrier layers 142 is Al(a)In(b)Ga(1-a-b)N (0≤a≤1, 0≤b≤1 and 0≤a+b≤1).

The quantum well layers 141 and the barrier layers 142 are arranged alternately, so any two adjacent quantum well layers 141 are separated by one barrier layer 142. Besides, the band gap of the barrier layers 142 is greater than that of the quantum well layers 141. Similarly, the average lattice constant of the quantum well structure 14 is greater than the lattice constant of the GaN layer 13. Therefore, the conduction band of the quantum well structure 14 can be away from Fermi level.

The two-dimension electron gas D close to the top of the quantum well structure 14 is of lower concentration. Thus, after the GaN transistor device 1 is turned on, the currents of the channels of the quantum well structure 14 may be influenced accordingly. However, in the embodiment, the quantum well structure 14 of the GaN transistor device 1 has multiple layers, so can provide plural current paths. Therefore, when the voltage is applied to the gate 16 to turn on the GaN transistor device 1, the currents passing through the channels of the quantum well structure 14 can obviously increase, so the GaN transistor device 1 can enhance performance and can satisfy the requirements of power devices.

Moreover, the thickness of the multi-layer quantum well structure 14 increases, which can enhance anti-polarization characteristic, effectively lift the energy level of the channels of the quantum well structure 14 and drive away the two-dimension electron gas D. Therefore, when the voltage is not applied to the gate 16, the energy level of the channels of the quantum well structure 14 can be away from Fermi level, so the GaN transistor device 1 can completely conform to the requirements of normally-off transistor devices.

The embodiment exemplifies the disclosure and is not intended to limit the scope of the disclosure. Any equivalent modification and variation according to the spirit of the disclosure is to be also included within the scope of the following claims and their equivalents.

The currently available transistor devices cannot achieve good reliability and the quality thereof cannot be easily controlled because of the limits of the manufacturing process. According to one embodiment of the disclosure, the etching process of the enhancement mode GaN transistor device can be controlled, so the quality of the transistor device can be optimized and the transistor device can achieve good reliability.

Besides, the currently available transistor device may have various problems, such as non-uniform electrical property, low initial voltage (or the initial voltage is less than 1 volt) and unstable gate thickness, because of the limits of the manufacturing process or the structure thereof. For the reason, the application of the currently available transistor devices is limited. On the contrary, according to one embodiment of the disclosure, the etching process of the enhancement mode GaN transistor device can be easily controlled, which can effectively improve the problem of non-uniform electrical property caused by the etching process, and can effectively control the initial voltage. Therefore, the design of the transistor device can be more flexible.

Moreover, according to one embodiment of the disclosure, the gate of the enhancement mode GaN transistor device is disposed on the quantum well structure. Thus, when the voltage is applied to the gate to turn on the transistor device, the quantum well structure can provide confined level for the transmission of the carriers, which can improve the performance of the transistor device.

Furthermore, according to one embodiment of the disclosure, the enhancement mode GaN transistor device has anti-polarization characteristic, so the energy level of the channels of the quantum well structure can be away from Fermi level when the voltage is not applied to the gate. Therefore, the transistor device can completely conform to the requirements of normally-off transistor devices. As described above, the enhancement mode GaN transistor device can definitely achieve unpredictable technical effects.

Figure 9:
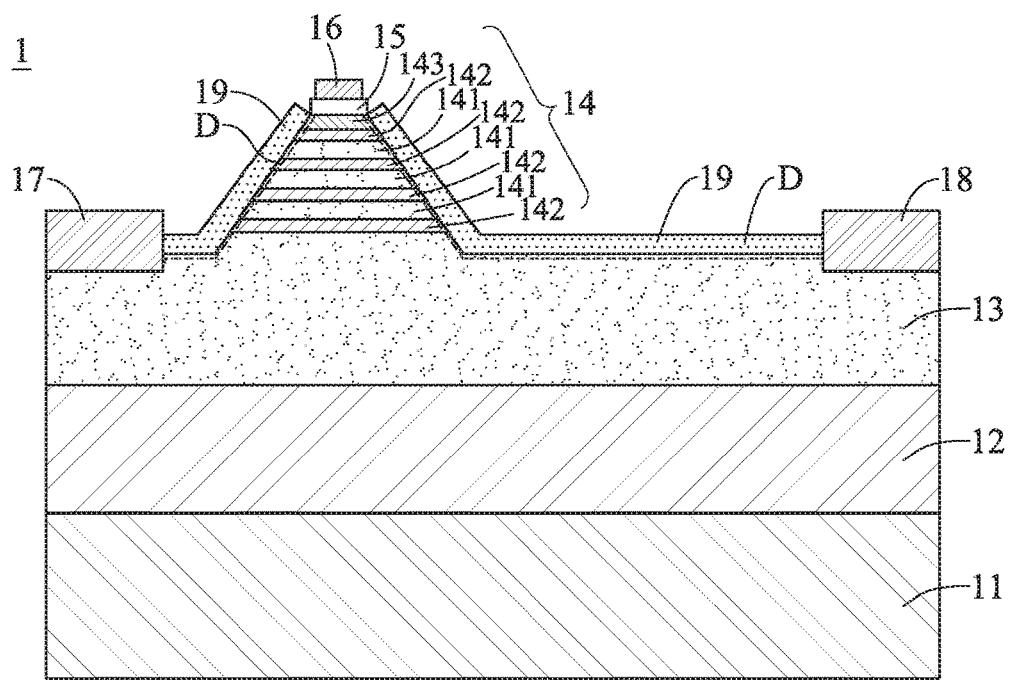
FIG. 9 is a cross-sectional view of an enhancement mode GaN transistor device in accordance with a fourth embodiment of the disclosure.
Figure 10:
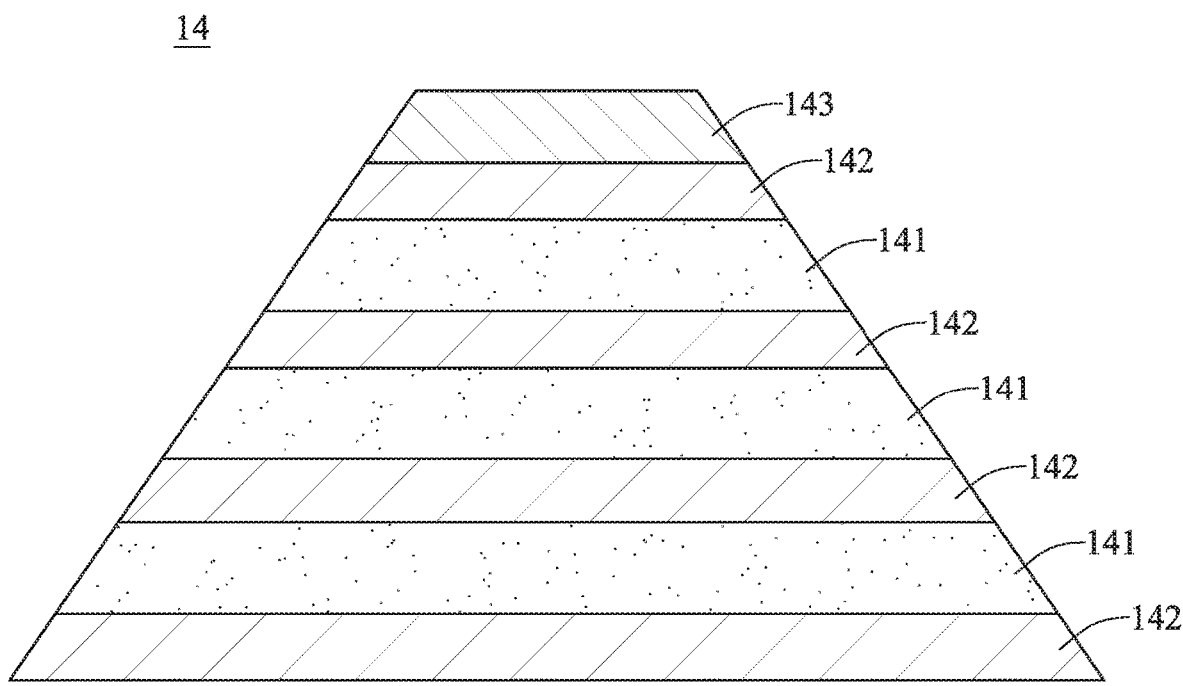
FIG. 10 is a cross-sectional view of a quantum well structure of the enhancement mode GaN transistor device in accordance with the fourth embodiment of the disclosure.

Please refer to FIG. 9 and FIG. 10. FIG. 9 is a cross-sectional view of an enhancement mode GaN transistor device in accordance with a fourth embodiment of the disclosure; FIG. 10 is a cross-sectional view of the quantum well structure of the enhancement mode GaN transistor device. As shown in FIG. 9, the enhancement mode GaN transistor device 1 includes a substrate 11, a buffer layer 12, a GaN layer 13, a quantum well structure 14, a dielectric 15, a gate 16, a source 17, a drain 18 and a first barrier layer 19.

The structures of the above elements and the cooperation relation thereof are similar to the previous embodiment, so will not be described herein. The difference between the embodiment and the previous embodiment is that the multi-layer quantum well structure 14 of the GaN transistor device 1 further includes an anti-polarization layer 143.

As shown in FIG. 10, the quantum well layers 141 and the barrier layers 142 are arranged alternately, so any two adjacent quantum well layers 141 are separated by one barrier layer 142. The anti-polarization layer 143 is disposed on the quantum well layers 141 and the barrier layers 142. The average lattice constant of the anti-polarization layer 143 is greater than the lattice constant of the GaN layer 113. Similarly, the band gap of the barrier layers 142 is greater than that of the quantum well layers 141. As described above, in the embodiment, the conduction band of the quantum well structure 14 can be away from Fermi level via the anti-polarization layer 143.

Via the above structure, the GaN transistor device 1 can enhance performance and can completely meet the requirements of normally-off transistor devices.

The embodiment exemplifies the disclosure and is not intended to limit the scope of the disclosure. Any equivalent modification and variation according to the spirit of the disclosure is to be also included within the scope of the following claims and their equivalents.

Please refer to FIG. 11A~FIG. 11F, which are schematic views of the enhancement mode GaN transistor device in accordance with the fourth embodiment of the disclosure. The embodiment further illustrates the method for manufacturing the enhancement mode GaN transistor device 1.

Figure 11A:
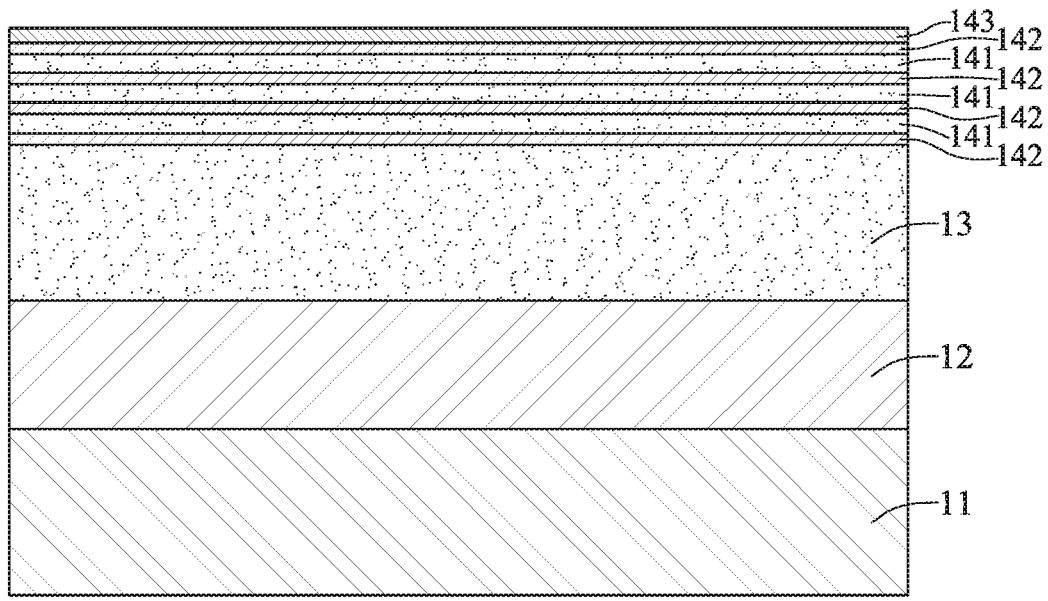
FIG. 11A~FIG. 11F are schematic views of the enhancement mode GaN transistor device in accordance with the fourth embodiment of the disclosure.

First, form an epitaxy stack via metal-organic chemical vapor deposition (MOCVD). The epitaxy stack includes a substrate 11, a buffer layer 12, a GaN layer 13, a plurality of quantum well layers 141, a plurality of barrier layers 142 and an anti-polarization layer 143, as shown in FIG. 11A.

Figure 11B:
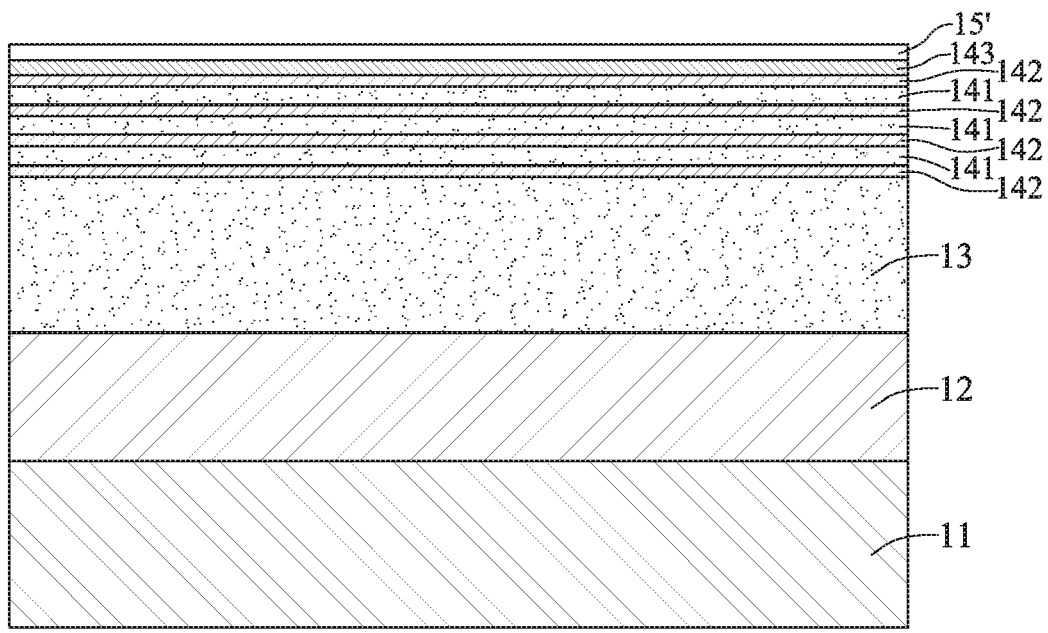

Next, deposit a dielectric capping layer 15' on the epitaxy stack, as shown in FIG. 11B.

Figure 11C:
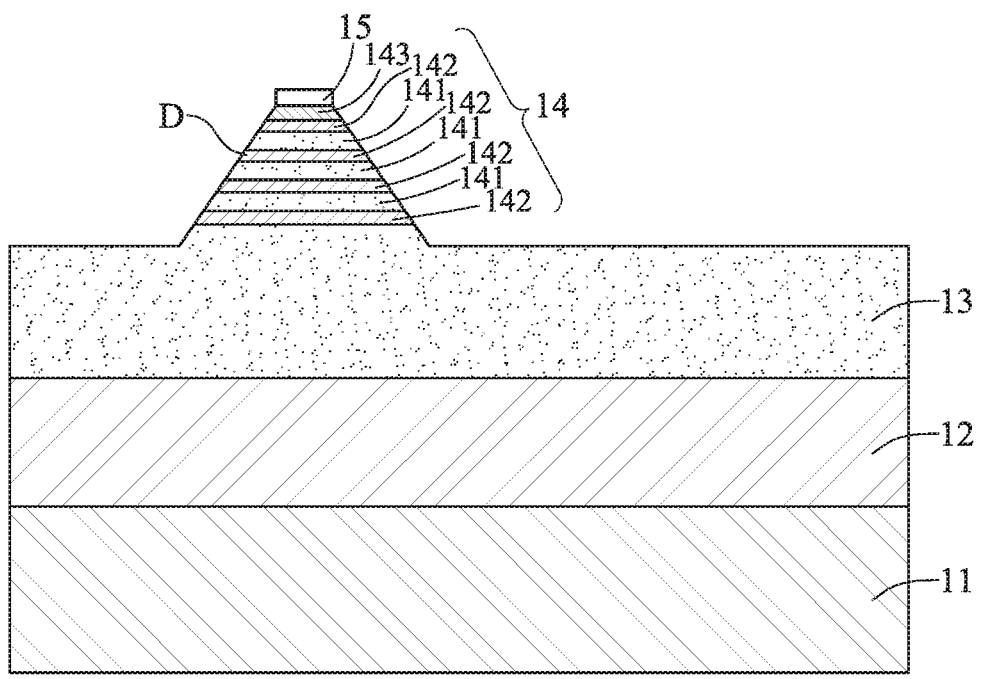
Figure 11D:
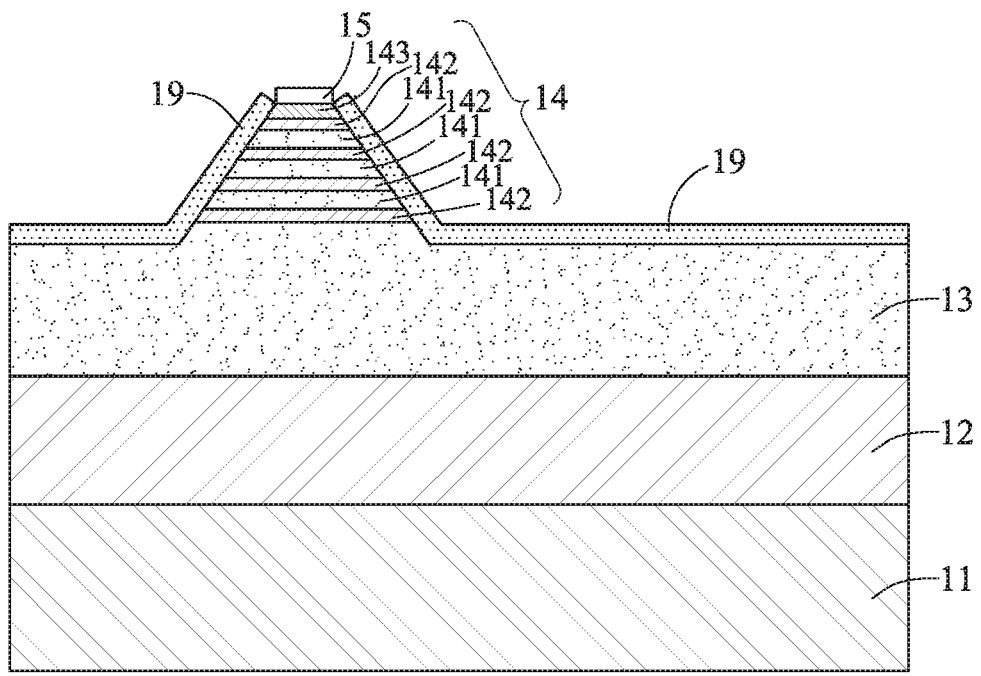

Then, etch the epitaxy stack to form a 3D quantum well structure 14 and a dielectric 15, as shown in FIG. 11C.

Afterwards, implement metal-organic chemical vapor deposition again to re-grow a first barrier layer 19 on the epitaxy stack and the dielectric 15 does not be covered by the first barrier layer 19.

Figure 11E:
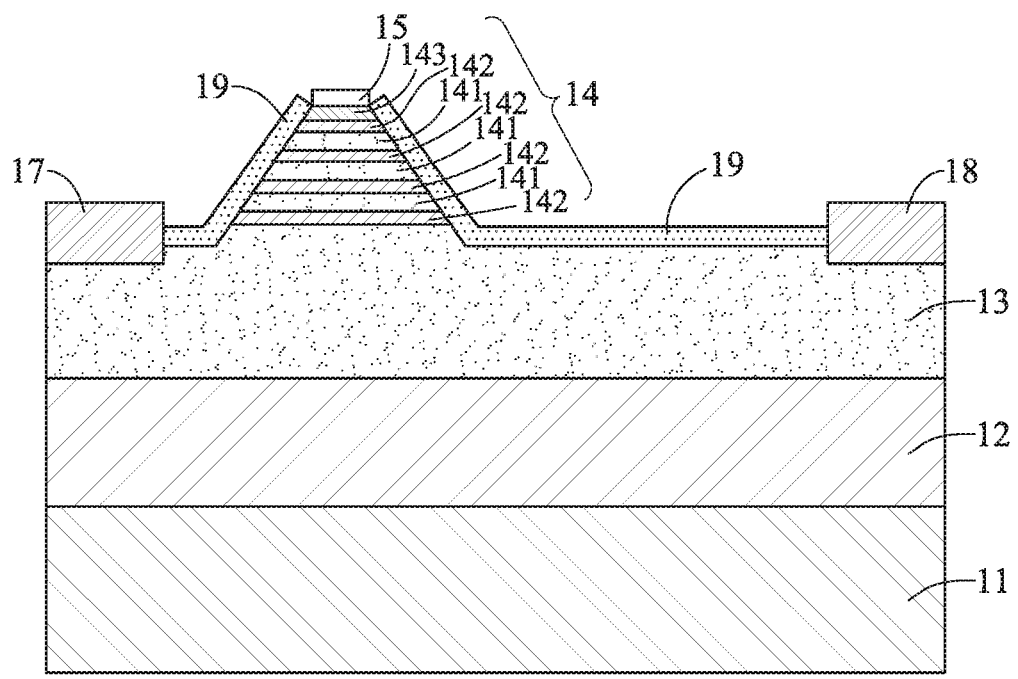

After that, form a source 17 and a drain 18 on the epitaxy stack, as shown in FIG. 11E.

Figure 11F:
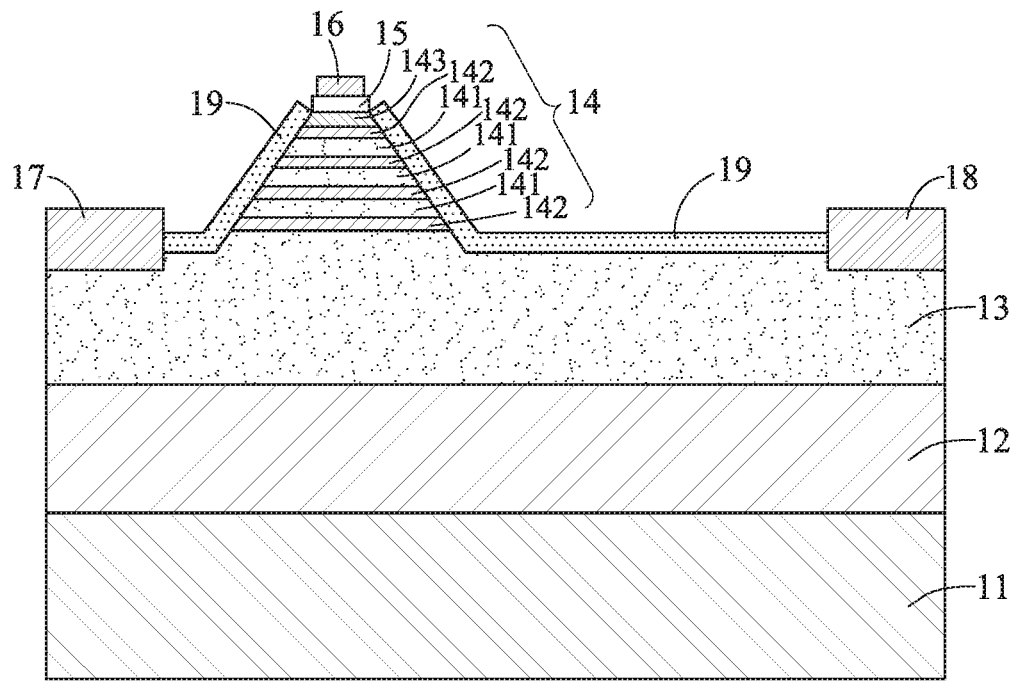

Finally, form a gate 16 on the dielectric 15, as shown in FIG. 11F.

The embodiment exemplifies the disclosure and is not intended to limit the scope of the disclosure. Any equivalent modification and variation according to the spirit of the disclosure is to be also included within the scope of the following claims and their equivalents.

Figure 12:
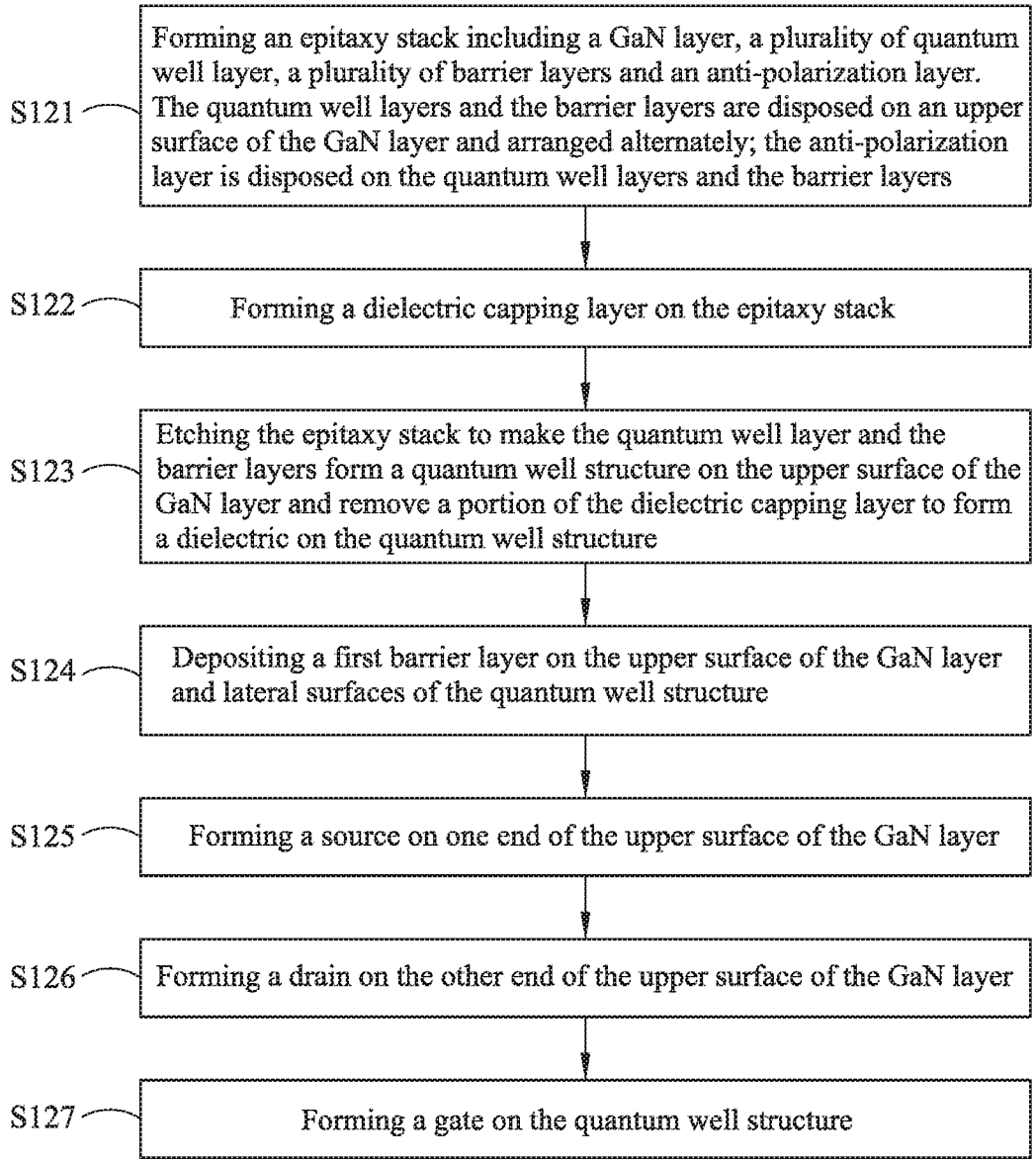
FIG. 12 is a flow chart of a manufacturing method of the enhancement mode GaN transistor device in accordance with the fourth embodiment of the disclosure.

Please refer to FIG. 12, which is a flow chart of a manufacturing method of the enhancement mode GaN transistor device in accordance with the fourth embodiment of the disclosure. In the embodiment, the method for manufacturing the enhancement mode GaN transistor device includes the following steps:

Step S121: forming an epitaxy stack including a GaN layer, a plurality of quantum well layer, a plurality of barrier layers and an anti-polarization layer. The quantum well layers and the barrier layers are disposed on an upper surface of the GaN layer and arranged alternately; the anti-polarization layer is disposed on the quantum well layers and the barrier layers.

Step S122: forming a dielectric capping layer on the epitaxy stack.

Step S123: etching the epitaxy stack to make the quantum well layer and the barrier layers form a quantum well structure on the upper surface of the GaN layer and remove a portion of the dielectric capping layer to form a dielectric on the quantum well structure.

Step S124: depositing a first barrier layer on the upper surface of the GaN layer and lateral surfaces of the quantum well structure.

Step S125: forming a source on one end of the upper surface of the GaN layer.

Step S126: forming a drain on the other end of the upper surface of the GaN layer.

Step S127: forming a gate on the quantum well structure.

Figure 13:
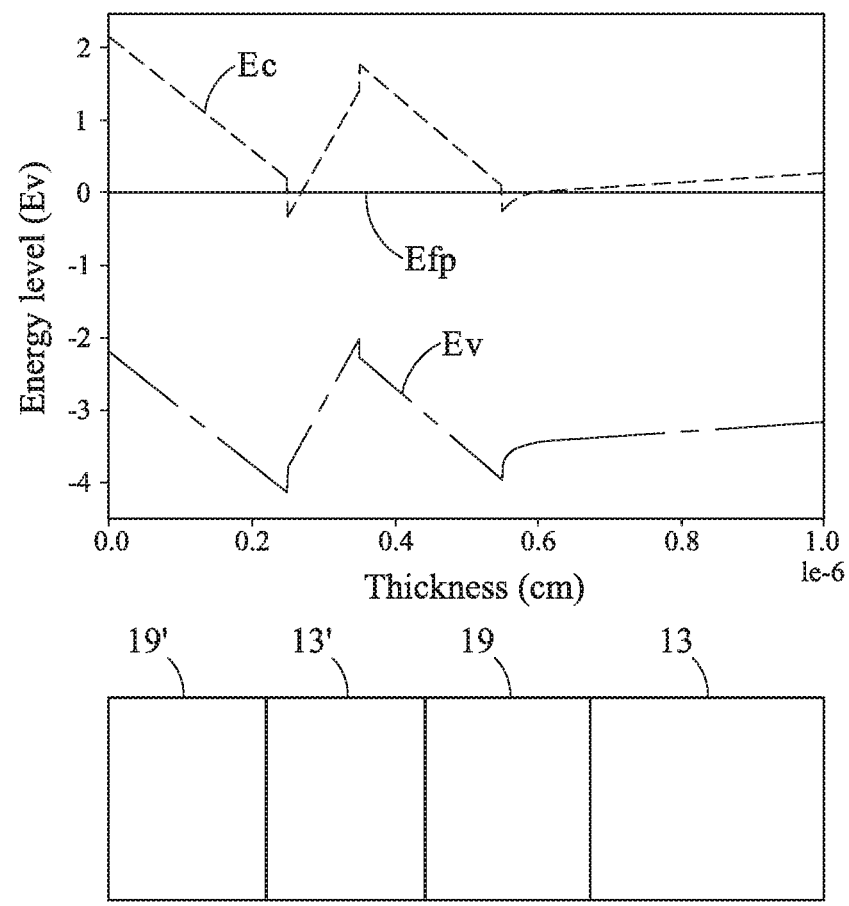
FIG. 13 is a simulation result of the enhancement mode GaN transistor device in accordance with the fifth embodiment of the disclosure.

Please refer to FIG. 13, which is a simulation result of the enhancement mode GaN transistor device in accordance with the fifth embodiment of the disclosure. The enhancement mode GaN transistor device 1 further includes a second barrier layer 19' (Al(0.5)In(0.05)Ga(0.45)), which is disposed on the first barrier layer 19 (Al(0.3)Ga(0.7)N) so as to form a dual-channel structure. The material of the first barrier layer 19 is Al(x)In(y)Ga(1-x-y)N and the material of the second barrier layer 19' is Al(x)In(y)Ga(1-x-y). Besides, the lattice constants of the first barrier layer 19 and the second barrier layer 19' are less than that of the GaN layer 13. In addition, there is another GaN layer 13' between the first barrier layer 19 and the second barrier layer 19'.

As shown in FIG. 13, the horizontal axis stands for the thickness (which is corresponding to the positions of the first barrier layer 19, the GaN layer 13', the second barrier layer 19' and the GaN layer 13). The vertical axis stands for the energy level, the curve Ec stands for the conduction band, the curve Ev stands for the valence band, and the curve Efp stands for Fermi level (electron hole). FIG. 13 clearly shows that the conduction bands of the first barrier layer 19 and the second barrier layer 19' can exceed Fermi level.

Compared with the signal-channel structure, the dual-channel structure of the embodiment can more obviously increase the currents after the GaN transistor device 1 is turned on. Thus, the GaN transistor device 1 of the embodiment can satisfy the requirements of power devices.

In summation of the description above, the enhancement mode GaN transistor device in accordance with the disclosure has the following benefits:

(1) According to one embodiment of the disclosure, the gate of the enhancement mode GaN transistor device is disposed on the quantum well structure. Thus, when the voltage is applied to the gate to turn on the transistor device, the quantum well structure can provide confined level for the transmission of the carriers, which can improve the performance of the transistor device.

(2) According to one embodiment of the disclosure, the enhancement mode GaN transistor device has anti-polarization characteristic, so the energy level of the channels of the quantum well structure can be away from Fermi level when the voltage is not applied to the gate. Therefore, the transistor device can completely conform to the requirements of normally-off transistor devices.

(3) According to one embodiment of the disclosure, the etching process of the enhancement mode GaN transistor device can be controlled, which can effectively improve the problem of non-uniform electrical property caused by the etching process, and can effectively control the initial voltage. Therefore, the design of the transistor device can be more flexible.

(4) According to one embodiment of the disclosure, the etching process of the enhancement mode GaN transistor device can be controlled, so the quality of the transistor device can be easily optimized and the transistor device can achieve good reliability.

It will be apparent to those skilled in the art that various modifications and variations can be made to the disclosed embodiments. It is intended that the specification and examples be considered as exemplary only, with a true scope of the invention being indicated by the following claims and their equivalents.

What is claimed is:

1. A method for manufacturing enhancement mode GaN transistor device, comprising:
   forming an epitaxy stack comprising a GaN layer, a quantum well layer and two barrier layers, wherein the quantum well layer and the barrier layers are disposed on an upper surface of the GaN layer, and the quantum well layer is disposed between the barrier layers;
   forming a dielectric capping layer on the epitaxy stack;
   etching the epitaxy stack and the dielectric capping layer to make the quantum well layer, the barrier layers and the dielectric capping layer form a quantum well structure on the upper surface of the GaN layer and a dielectric on the quantum well structure;
   depositing a first barrier layer on the upper surface of the GaN layer, wherein the first barrier layer extends to lateral surfaces of the quantum well structure and covers the quantum well structure while the dielectric is exposed from the first barrier layer;
   forming a source on one end of the upper surface of the GaN layer;
   forming a drain on the other end of the upper surface of the GaN layer; and
   forming a gate on the dielectric, wherein the gate is exposed from the first barrier layer.

2. The method of claim 1, wherein a step of etching the epitaxy stack to make the quantum well layer and the barrier layers form the quantum well structure on the upper surface of the GaN layer further comprises:
   forming the quantum well structure having a cone shape.

3. The method of claim 1, wherein a step of forming the epitaxy stack comprising the GaN layer, the quantum well layer and the barrier layers further comprises:
   forming an anti-polarization layer on the quantum well layer and the barrier layers.

4. The method of claim 1, further comprising:
   forming a second barrier layer on the first barrier layer.

5. An enhancement mode GaN transistor device, comprising:
   a quantum well structure disposed on an upper surface of a GaN layer;
   a dielectric disposed on the quantum well structure;
   a gate disposed on the dielectric;
   a source disposed on one end of the upper surface of the GaN layer;
   a drain disposed on the other end of the upper surface of the GaN layer; and
   a first barrier layer disposed on the upper surface of the GaN layer;
   wherein the first barrier layer extends to lateral surfaces of the quantum well structure and covers the quantum well structure while the gate and the dielectric are exposed from the first barrier layer.

6. The enhancement mode GaN transistor device of claim 5, wherein a material of the first barrier layer comprises Al(x)In(y)Ga(1-x-y)N and a lattice constant of the first barrier layer is less than a lattice constant of the GaN layer.

7. The enhancement mode GaN transistor device of claim 5, further comprising a buffer layer and a substrate, wherein the GaN layer is disposed on the buffer layer and the buffer layer is disposed on the substrate.

8. The enhancement mode GaN transistor device of claim 5, wherein the quantum well structure is substantially a cone, and the gate is disposed on a tip of the cone or a plane surface on a top of the cone.

9. The enhancement mode GaN transistor device of claim 5, wherein an average lattice constant of the quantum well structure is higher than a lattice constant of the GaN layer.

10. The enhancement mode GaN transistor device of claim 5, further comprising a second barrier layer disposed on the first barrier layer.

11. The enhancement mode GaN transistor device of claim 10, wherein a material of the second barrier layer is Al(x)In(y)Ga(1-x-y) and a lattice constant of the second barrier layer is less than a lattice constant of the GaN layer.

12. The enhancement mode GaN transistor device of claim 5, wherein the quantum well structure comprises a plurality of quantum well layers and a plurality of barrier layers, and the quantum well layers and the barrier layers are arranged alternately.

13. The enhancement mode GaN transistor device of claim 12, wherein the quantum well structure further comprises an anti-polarization layer including the quantum well layers and the barrier layers, and an average lattice constant of the quantum well structure is greater than a lattice constant of the GaN layer.

14. The enhancement mode GaN transistor device of claim 12, wherein a material of the quantum well layer comprises $Al(x)In(y)Ga(1-x-y)N$, and $\leq x \leq 1$, $0 \leq y \leq 1$ and $0 \leq x+y \leq 1$.

15. The enhancement mode GaN transistor device of claim 12, wherein a material of the barrier layers comprises $Al(a)In(b)Ga(1-a-b)N$, and $0 \leq a \leq 1$, $0 \leq b \leq 1$ and $0 \leq a+b \leq 1$.

16. The enhancement mode GaN transistor device of claim 12, wherein a band gap of the barrier layers is greater than a band gap of the quantum well layer.

17. The enhancement mode GaN transistor device of claim 5, wherein the quantum well layer comprises a quantum well layer and two barrier layers, and the quantum well structure is disposed between the barrier layers.

18. The enhancement mode GaN transistor device of claim 17, wherein the quantum well layer further comprises an anti-polarization layer of the quantum well layer or the barrier layers, and an average lattice constant of the quantum well structure is greater than the lattice constant of the GaN layer.

19. The enhancement mode GaN transistor device of claim 17, wherein a material of the quantum well layer comprises $Al(x)In(y)Ga(1-x-y)N$, and $0 \leq x \leq 1$, $0 \leq y \leq 1$ and $0 \leq x+y \leq 1$.

20. The enhancement mode GaN transistor device of claim 17, wherein a material of the barrier layers comprises $Al(a)In(b)Ga(1-a-b)N$, and $0 \leq a \leq 1$, $0 \leq b \leq 1$ and $0 \leq a+b \leq 1$.

21. The enhancement mode GaN transistor device of claim 17, wherein a band gap of the barrier layers is greater than a band gap of the quantum well layer.

* * * * *